(12) United States Patent
Taniguchi et al.

(10) Patent No.: US 8,876,414 B2
(45) Date of Patent: Nov. 4, 2014

(54) OPTICAL COMMUNICATION MODULE AND METHOD OF MANUFACTURING THE SAME

(71) Applicant: Honda Tsushin Kogyo Co., Ltd., Tokyo (JP)

(72) Inventors: Teruyuki Taniguchi, Tokyo (JP); Yuushi Miki, Tokyo (JP); Koichiro Yoshimura, Tokyo (JP); Shigehiro Oi, Tokyo (JP)

(73) Assignee: Honda Tsushin Kogyo Co., Ltd., Tokyo (JP)

( * ) Notice: Subject to any disclaimer, the term of this patent is extended or adjusted under 35 U.S.C. 154(b) by 43 days.

(21) Appl. No.: 13/673,225

(22) Filed: Nov. 9, 2012

(65) Prior Publication Data

US 2013/0121652 A1    May 16, 2013

(30) Foreign Application Priority Data

Nov. 10, 2011  (JP) .................................. 2011-246305

(51) Int. Cl.
| | |
|---|---|
| *G02B 6/36* | (2006.01) |
| *G02B 6/42* | (2006.01) |
| *H05K 3/30* | (2006.01) |
| *H05K 1/14* | (2006.01) |
| *H05K 1/18* | (2006.01) |

(52) U.S. Cl.
CPC ........ *G02B 6/42* (2013.01); *H05K 2201/09181* (2013.01); *H05K 2201/049* (2013.01); *H05K 1/18* (2013.01); *G02B 6/4204* (2013.01); *H05K 3/30* (2013.01); *H05K 2201/10121* (2013.01); *G02B 6/428* (2013.01); *H05K 2201/1034* (2013.01); *G02B 6/422* (2013.01); *H05K 1/141* (2013.01)

USPC ................................... 385/93; 385/88; 29/832

(58) Field of Classification Search
CPC .................. G02B 6/4292–6/43; G02B 6/4246; G02B 6/4201; G02B 6/4204; G02B 6/4214; G02B 6/3893; G02B 6/32; G02B 6/3897; G02B 6/4206; G02B 6/428; G02B 6/4281; G02B 7/002; H01L 23/055; H01L 23/10; H01L 25/167; H01S 5/022

USPC .......................................... 385/88–93; 29/832

See application file for complete search history.

(56) References Cited

U.S. PATENT DOCUMENTS 4,790,894 A *  12/1988  Homma et al. ................ 156/250
7,699,618 B2 *   4/2010  Sone ............................... 439/67

(Continued)

FOREIGN PATENT DOCUMENTS

JP       11-287931 A    10/1999
JP       2002-023019 A   1/2002

*Primary Examiner* — Ellen Kim
(74) *Attorney, Agent, or Firm* — Edwards Wildman Palmer LLP; James E. Armstrong, IV; George N. Chaclas

(57) ABSTRACT

An optical device board 2 is set to be a printed circuit board in which an optical device 6 is bonded into a predetermined position of a printed wiring board 5. The optical device board 2 is bonded to a base board 3 provided with a plurality of wiring terminals 7. A lens barrel 4 is bonded to the optical device board 2. The optical device 6 is bonded into a position calculated from an actual measured dimension of the printed wiring board 5, and the calculated position is held and positioning is carried out in such a manner that a central axis of the lens barrel 4 is coincident with the calculated position when the lens barrel 4 is to be bonded to the optical device board 2.

13 Claims, 4 Drawing Sheets

(56) References Cited

U.S. PATENT DOCUMENTS

| | | | |
|---|---|---|---|
| 8,023,789 B2* | 9/2011 | Aoyagi et al. | 385/128 |
| 2001/0028104 A1* | 10/2001 | Fukatsu et al. | 257/685 |
| 2007/0089900 A1* | 4/2007 | Mitamura et al. | 174/254 |
| 2011/0064365 A1* | 3/2011 | Togami et al. | 385/93 |

* cited by examiner

OPTICAL COMMUNICATION MODULE AND METHOD OF MANUFACTURING THE SAME

BACKGROUND OF THE INVENTION (1) Field of the Invention

The present invention relates to an optical communication module and a method of manufacturing the same, and more particularly to an optical communication module which is suitable for using a plastic optical fiber and a method of manufacturing the same.

(2) Description of Related Art

A TOSA incorporating a light emitting device (VCSEL) to carry out transmission and an ROSA incorporating a light receiving device (PD) to carry out receipt are known as an optical communication module. As illustrated in FIG. 7, there is known a TO-CAN type optical communication module 51 including abase table 52 provided with an optical device (light emitting device or light receiving device) 53 and a lens barrel 54 provided with a lens 55, the base table 52 and the lens barrel 54 being aligned and coupled to each other.

In the optical communication module 51, an optical axis alignment of the optical device 53 and the lens 55 is important. As a general method, the optical axis alignment is carried out while light is actually emitted and a light quantity is monitored, and the base table 52 and the lens barrel 54 are subjected to spot welding to be thus integrated with each other in a position in which an optimum state is brought (Japanese Laid-Open Patent Publications Nos. 2002-23019 and Hei 11-287931, and the like).

SUMMARY OF THE INVENTION

Referring to the optical axis alignment disclosed in Japanese Laid-Open Patent Publications Nos. 2002-23019 and Hei 11-287931, an alignment jig for actually emitting light (or measuring a light receiving sensitivity) is required, and furthermore, a long time is taken for the optical axis alignment during the execution of the monitoring. For this reason, there is a problem in that a manufacturing cost is increased.

It is an object of the present invention to provide an optical communication module capable of reducing a manufacturing cost and a method of manufacturing the same.

The optical communication module according to the present invention includes an optical device board provided with an optical device, and a lens barrel provided with a lens, wherein the optical device board is set to be a printed circuit board in which the optical device is bonded into a predetermined position on a printed wiring board and the lens barrel is bonded to the optical device board.

According to the optical communication module of the present invention, it is possible to bond the optical device into a position calculated from an actual measured dimension of the printed wiring board, and to hold the calculated position and to carry out positioning in such a manner that a central axis of the lens barrel is coincident with the calculated position (mechanical optical axis alignment) when bonding the lens barrel to the optical device board. Consequently, it is possible to omit work for actually emitting light in order to carry out the optical axis alignment of the optical device and the lens. Thus, it is possible to reduce a manufacturing cost .

There is further provided a base board provided with a plurality of wiring terminals, the optical device board having a plurality of via holes provided at a predetermined interval, the via holes being cut to take a semicircular shape along each of long sides of the printed wiring board taking a rectangular shape, and a pad provided on the base board and the via holes cut to take the semicircular shape being superposed on each other so that the optical device board and the base board are bonded to each other through a conductive bonding member applied to each of the via holes.

By utilizing the via hole provided on the printed wiring board to be used for electrical connection between layers, for connecting the optical device board and the base board, thus, it is possible to visually recognize a positional relationship between the via hole of the printed wiring board and the pad of the base board. Thus, it is possible to easily carry out work for bonding the optical device board to the base board.

Moreover, a plurality of wiring terminals is provided on the optical device board in some cases. In other words, as described above, the base board is not set to be a separate component (three-component structure including the optical device board, the base board and the lens barrel) but functions obtained by adding the optical device board and the base board (optical device, driver IC, wiring terminal and the like) are mounted on a single printed circuit board. Consequently, the optical communication module can also have a two-component structure including the single board and the lens barrel.

Consequently, it is possible to decrease a number of the components, thereby reducing a manufacturing cost still more.

According to the present invention, a method of manufacturing an optical communication module having an optical device board formed by bonding an optical device into a predetermined position on a printed wiring board and a lens barrel provided with a lens, includes the steps of actually measuring a dimension of the printed wiring board, calculating a position in the printed wiring board where the optical device is to be disposed based on an actual measured value, bonding the optical device into the calculated position for the disposition of the optical device, thereby fabricating the optical device board, and bonding the lens barrel to the optical device board in alignment with the calculated position for the disposition of the optical device.

According to the method of manufacturing an optical communication module of the present invention, it is possible to bond the optical device into the position calculated from the actual measured dimension of the printed wiring board, and to hold the calculated position and to carry out positioning in such a manner that a central axis of the lens barrel is coincident with the calculated position (mechanical optical axis alignment) when bonding the lens barrel to the optical device board. Consequently, it is possible to omit work for actually emitting light in order to carry out the optical axis alignment of the optical device and the lens. Thus, it is possible to reduce a manufacturing cost.

The optical communication module includes the base board separately from the optical device board in some cases. In these cases, a step of bonding the optical device board to the base board is added after the step of bonding the lens barrel to the optical device board in alignment with the calculated position for the disposition of the optical device.

As a step of cutting the printed wiring board, a cutting step of cutting the printed wiring board with high precision may be provided in addition to the conventional cutting step. Although the printed wiring board is usually set to take a square shape, the present invention is not restricted thereto. Moreover, the calculated position for the disposition of the optical device is set to be a position in which vertical and transverse parts are divided into 1 to a (for example, a=2) and 1 to b (for example, b=1), respectively, for instance.

An actual dimension of the printed wiring board has a great error (approximately ±30 μm) made by cutting. In the case where the dimension is not actually measured but the optical device is disposed in a preset position, therefore, there is a problem in that a shift of the central axis of the lens barrel to be bonded subsequently from the optical device is increased. On the other hand, at both of the steps of actually measuring the dimension of the printed wiring board to calculate the position in the printed wiring board where the optical device is to be disposed, thereby bonding the optical device and bonding the lens barrel, the calculated position is used as a reference value for positioning. Consequently, it is possible to reduce the shift of the central axis of the lens barrel from the optical device. The shift of the central axis of the lens barrel from the optical device which is thus obtained is greater (approximately ±10 µm) than that of the case where light is actually emitted to carry out the optical axis alignment of optical device and the lens. However, it is possible to set the shift which does not practically matter. In the case where an optical fiber is a plastic optical fiber, particularly, it is possible to increase a bore diameter. Therefore, it is possible to eliminate the influence of the shift. By a combination with the plastic optical fiber, consequently, it is possible to obtain optical communication means which is very excellent in practicability.

According to the optical communication module of the present invention, the optical device board is set to be the printed circuit board in which the optical device is bonded into the predetermined position of the printed wiring board, and the lens barrel is bonded to the optical device board. By bonding the optical device into the position calculated from the actual measured dimension of the printed wiring board, holding the calculated position and carrying out positioning in such a manner that the central axis of the lens barrel is coincident with the calculated position when bonding the lens barrel to the optical device board, consequently, it is possible to carry out the optical axis alignment through mechanical alignment. Accordingly, it is not necessary to employ an expensive measurement or alignment jig. Thus, it is possible to reduce a cost.

According to the method of manufacturing an optical communication module of the present invention, there are provided the steps of actually measuring a dimension of the printed wiring board, calculating a position in the printed wiring board where the optical device is to be disposed based on an actual measured value, bonding the optical device into the calculated position for the disposition of the optical device, thereby fabricating the optical device board, and bonding the lens barrel to the optical device board in alignment with the calculated position for the disposition of the optical device. Therefore, it is possible to carry out the optical axis alignment through mechanical alignment. Accordingly, it is not necessary to employ an expensive measurement or alignment jig. Thus, it is possible to reduce a cost of the optical communication module.

DETAILED DESCRIPTION OF PREFERRED EMBODIMENTS

An embodiment of the present invention will be described below with reference to the drawings.

Figure 1:
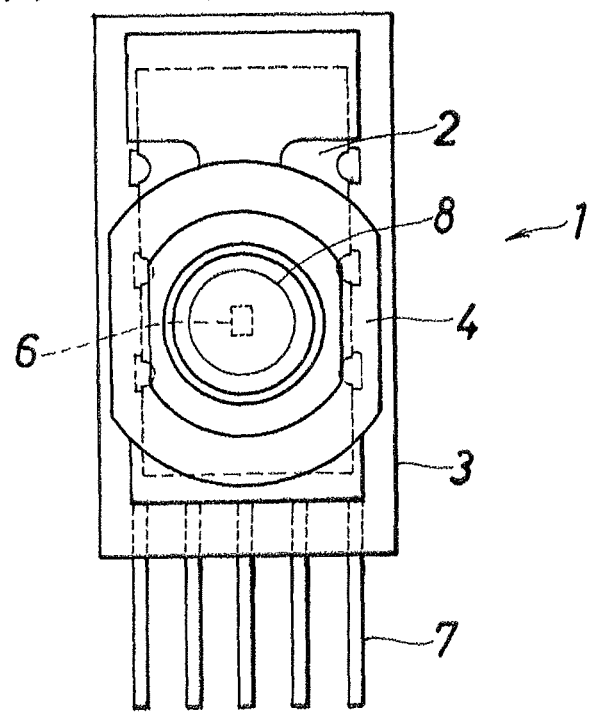
FIG. 1 is a front view illustrating an embodiment of an optical communication module according to the present invention.
Figure 2:
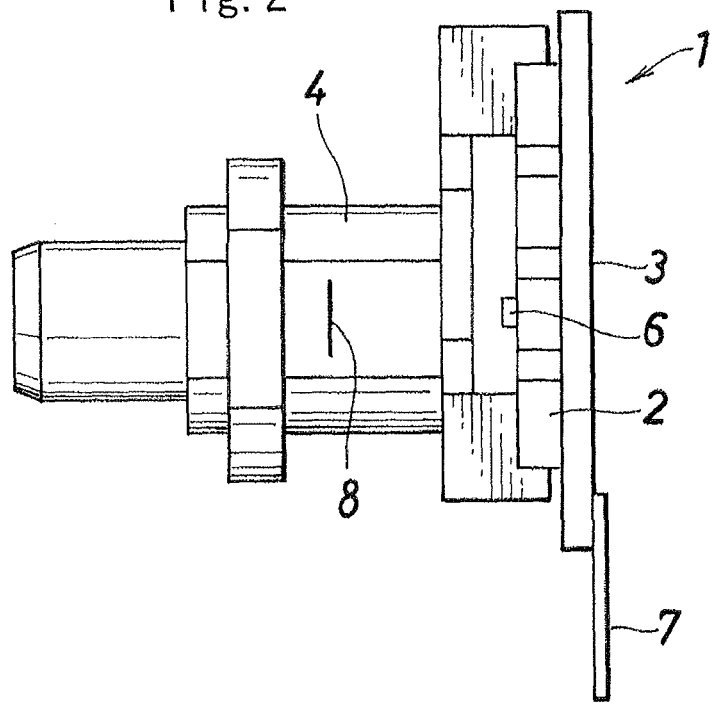
FIG. 2 is a side view illustrating the same.

As illustrated in FIGS. 1 and 2, an optical communication module 1 according to the present invention includes an optical device board 2 provided with an optical device 6, a base board 3 provided with a plurality of wiring terminals 7, and a lens barrel 4 provided with a lens 8.

The optical communication module 1 is used as a TOSA (transmission module) by setting the optical device 6 to be a VCSEL, and is used as an ROSA (receiving module) by setting the optical device 6 to be a PD (Photo Diode) and changing the order of an arrangement of the wiring terminal 7.

Figure 4:
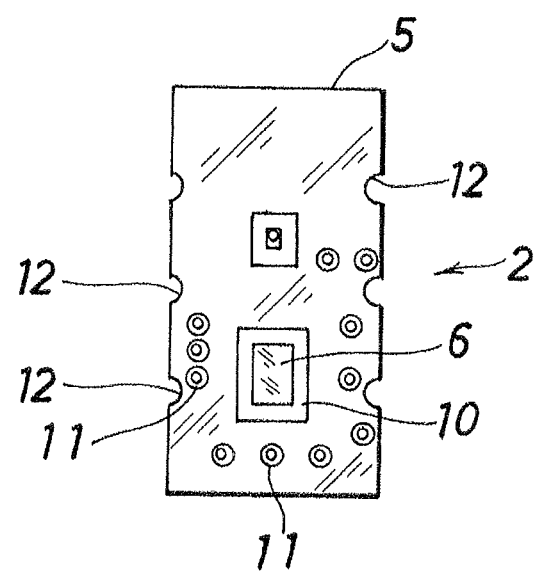
FIG. 4 is a front view illustrating a cut shape of the printed wiring board constituting the optical device board.

The optical device board 2 is set to be a printed circuit board in which the optical device 6 is bonded into a predetermined position of a printed wiring board 5 as illustrated in FIG. 4. The optical device board 2 is provided with the optical device 6 and a driver for driving the same. The printed wiring board 5 is provided with a pad 10 for bonding the optical device 6 or the like and a plurality of via holes 11 to be used for electrical connection. The via hole 11 includes a land having a certain width and a through hole for electrically connecting a surface and a back of the printed wiring board 5. The optical device 6 is set to have a size of approximately 250 µm, and the pad 10 for bonding the optical device 6 has a size from a double thereof to four times as large as the same. Even if a position in the printed wiring board 5 where the optical device 6 is to be disposed is shifted slightly, the size is not influenced.

Figure 3:
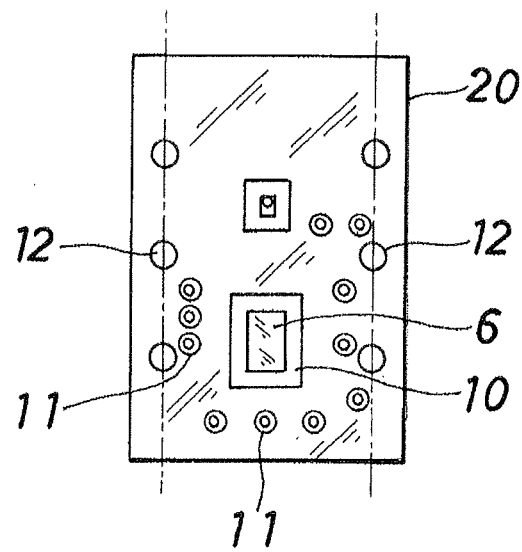
FIG. 3 is a front view illustrating a non-cut shape of a printed wiring board constituting an optical device board.

The printed wiring board 5 forming the optical device board 2 has a size acquired by further cutting a printed wiring board 20 taking a rectangular shape illustrated in FIG. 3 obtained in a normal process by means of a dicer in a position shown in a dashed line to reduce a width thereof. Three via holes 12 are disposed side by side on both side surfaces in positions to be the side surfaces through the cutting, and are set to take a semicircular shape through the cutting. As a result, the via holes 12 cut to take a semicircular shape along respective long sides are provided at a predetermined interval as illustrated in FIG. 4 in the printed circuit board forming the optical device board 2.

Figure 5:
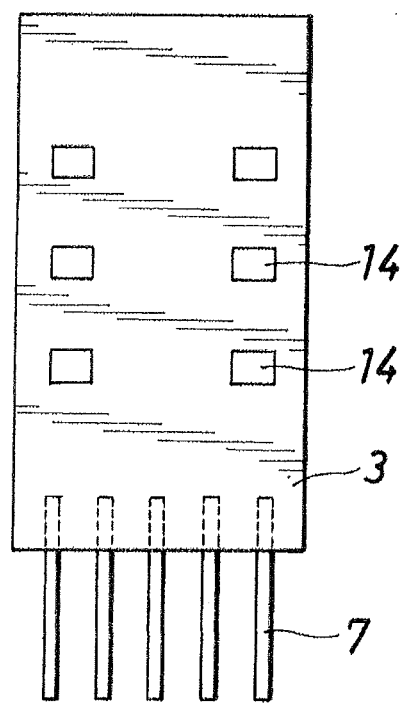
FIG. 5 is a front view illustrating a shape of a base board.
Figure 6:
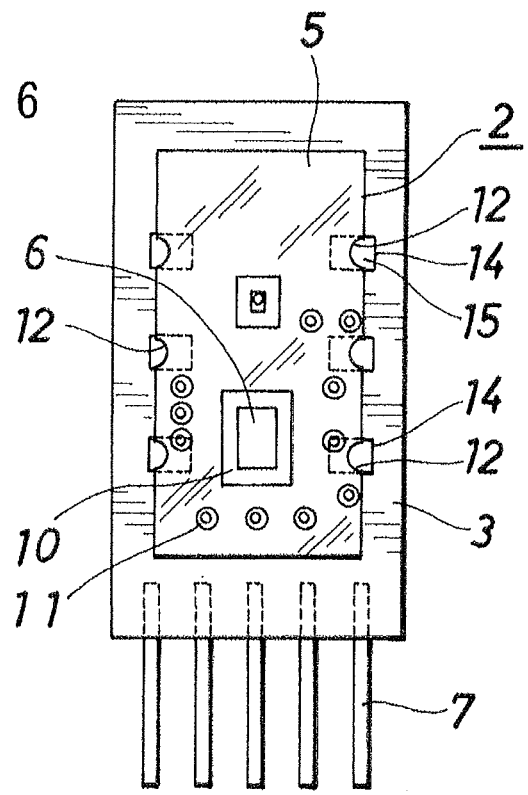
FIG. 6 is a front view illustrating a state in which the optical device board and the base board are bonded to each other.
Figure 7:
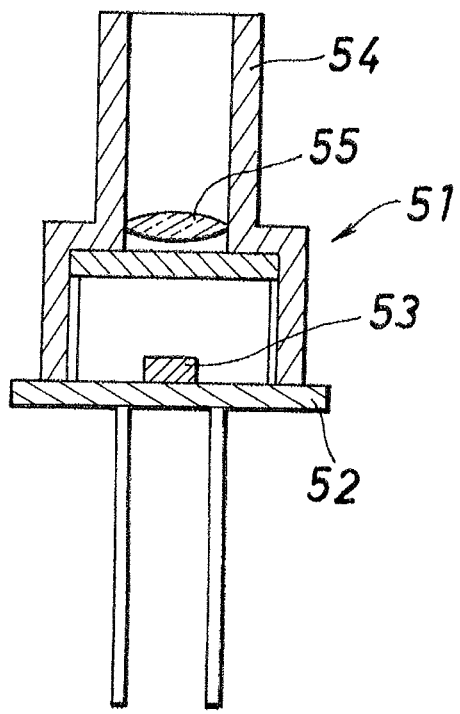
FIG. 7 is a sectional view illustrating an example of a conventional optical communication module.

As illustrated in FIG. 5, a pad 14 is provided in a plurality of places over a surface of the base board 3 (surface to be superposed on the optical device board 2). A circuit such as an amplifier or an IC is provided on a back face of the base board 3, which is not illustrated. As illustrated in FIG. 6, the pad 14 provided on the base board 3 is superposed on the via holes 12 cut to take a semicircular shape, and the optical device board 2 and the base board 3 are bonded to each other through an Ag paste (conductive bonding member) 15 applied to each of the via holes 12.

In the bonding of the optical device board 2 and the base board 3, for example, it is also possible to superpose and bond the pads provided on both of the boards 2 and 3 respectively. In this case, however, there is a problem in that a position of the pad cannot be seen in the bonding. By half cutting the via hole 12 provided on the printed wiring board so as to be used for electrical connection between layers and utilizing the half-cut via hole 12 for connecting the optical device board 2 and the base board 3, therefore, it is possible to visually recognize a positional relationship between the via hole 12 of the printed wiring board 5 and the pad 14 of the base board 3. Consequently, it is possible to easily carry out work for bonding the optical device board 2 to the base board 3.

A method of manufacturing an optical communication module according to the present invention serves to manufacture the optical communication module 1 including the optical device board 2, the base board 3 and the lens barrel 4, and includes (a) a step of fabricating the printed wiring board 5, (b) a step of actually measuring a dimension of the printed wiring board 5, (c) a step of calculating a position in the printed wiring board 5 where an optical device is to be disposed based on an actual measured value, (d) a step of aligning and bonding the optical device 6 into the calculated position for the disposition of the optical device, (e) a step of carrying out alignment with the calculated position for the disposition of the optical device, thereby bonding the lens barrel 4 to the optical device board 2, and (f) a step of bonding, to the base board 3, the optical device board 2 having the lens barrel 4 bonded thereto.

Each of the steps is executed automatically and the alignment is carried out by well-known image processing.

Step (a) of fabricating the printed wiring board 5 includes step (a1) of fabricating a board sheet to be obtained by forming a series of printed wiring boards 20 for a single sheet vertically and transversely and step (a2) of cutting the printed wiring boards 20 for a single sheet into a predetermined size. Cutting step (a2) includes a cutting step of cutting the printed wiring boards 20 for a single sheet away from the board sheet one by one and then reducing a width of the printed wiring board 20 to obtain the printed wiring board 5 for the optical device board 2 illustrated in FIG. 4.

In cutting step (a2), an error (approximately ±30 μm) is made by the cutting. For this reason, each of the printed wiring boards 5 has a different dimension. In step (b) of actually measuring the dimension of the printed wiring board 5, therefore, the actual measurement is carried out every printed wiring board 5 to acquire an actual dimension.

Instep (c) of calculating a position in the printed wiring board 5 where an optical device is to be disposed based on an actual measured value, the position in which the optical device 6 is to be disposed is calculated based on a transverse dimension and a vertical dimension which are actually measured. Referring to the position for the disposition, a transverse direction is set to be a position of 1 to 1, for example, and a vertical direction is set to be 1 to 2, for example.

In step (d) of bonding the optical device 6, the optical device 6 is bonded every printed wiring board 5 based on the calculated position.

In step (e) of bonding the lens barrel 4 to the optical device board 2, the lens barrel 4 is not disposed in a preset reference position but is positioned in such a manner that a central axis of the lens barrel 4 is coincident with the position for the disposition of the optical device which is calculated based on the actual measured value.

In step (f) of bonding the optical device board 2 to the base board 3, the semicircular via hole 12 and the pad 14 are put together and the Ag paste 15 is applied to the via hole 12 so that the optical device board 2 and the base board 3 are bonded to each other.

In the manufacturing method, in the case where an actual dimension of the printed wiring board 5 is different from a design dimension of the printed wiring board 5, a disposition position calculated based on the actual dimension is shifted from a disposition position obtained in the case of the design dimension of the printed wiring board 5. In this case, in step (d) of bonding the optical device 6, the optical device 6 is not disposed in the position obtained in the case of the design dimension but disposed in the position calculated based on the actual dimension. Also in step (e) of bonding the lens barrel 4 to the optical device board 2, the lens barrel 4 is disposed in such a manner that the central axis thereof is placed in the position calculated based on the actual dimension. Consequently, it is possible to reduce the shift of the central axis of the lens barrel 4 from the optical device 6. The shift of the central axis of the lens barrel 4 from the optical device 6 thus obtained is greater (approximately ±10 μm) than that of the case where light is actually emitted to carry out optical axis alignment of the optical device and a lens. However, it is possible to set a size which does not practically matter. In the case where an optical fiber is a plastic optical fiber, particularly, it is possible to increase a bore diameter. Therefore, it is possible to eliminate the influence of the shift. By a combination with the plastic optical fiber, thus, it is possible to obtain optical communication means which is very excellent in practicability.

Although the optical device board 2 and the base board 3 are set to be separate components in the optical communication module 1, mounted components provided on the back faces of the wiring terminals 7 and the base board 3 may be disposed on the optical device board 2 to obtain a two-component structure including a single printed circuit board, that is, the optical device board 2 and the lens barrel 4. In this case, it is not necessary to provide step (f) of bonding the optical device board 2 to the base board 3. Consequently, a manufacturing process can be simplified and a manufacturing cost can further be reduced.

What is claimed is:

1. An optical communication module comprising:
a base board provided with a plurality of wiring terminals;
an optical device board including an optical device mounted on a printed wiring board; and
a lens barrel provided with a lens,
wherein: optical device is bonded into a predetermined position on the printed wiring board; and the lens barrel is bonded to the optical device board.

2. The optical communication module according to claim 1, wherein the optical device board is a rectangular shape and has a plurality of via holes provided at a predetermined interval, the via holes being cut to take a semicircular shape along each of long sides of the printed wiring board, and a plurality of pads provided on the base board and the via holes cut to take the semicircular shape being superposed on each other so that the optical device board and the base board are bonded to each other through a conductive bonding member applied to each of the via holes.

3. The optical communication module according to claim 1, wherein the optical device is bonded into a position calculated from an actual measured dimension of the printed wiring board and positioning is carried out in such a manner that a central axis of the lens barrel is coincident with the calculated position when bonding the lens barrel to the optical device board.

4. A method of manufacturing an optical communication module including an optical device board formed by bonding an optical device into a predetermined position on a printed wiring board and a lens barrel provided with a lens, the method comprising the steps of:
actually measuring a dimension of the printed wiring board;
calculating a position in the printed wiring board where the optical device is to be disposed based on an actual measured value;

bonding the optical device into the calculated position for the disposition of the optical device, thereby fabricating the optical device board.

5. The method of claim 4, further comprising the steps of:
aligning a plastic optical fiber to the optical device and the lens; and
using image processing for the alignment.

6. The method of claim 4, wherein the optical device board and the base board are set to be a single printed circuit board.

7. The method of claim 4, further comprising the step of: bonding the lens barrel to the optical device board in alignment with the calculated position for the disposition of the optical device.

8. The method of claim 7, wherein bonding the lens barrel to the optical device board is without emitting or monitoring light.

9. The method of claim 4, further comprising the step of: wherein each of the steps is executed automatically and the alignment is carried out by image processing.

10. The optical communication module according to claim 1,
further comprising a plastic optical fiber aligned to the optical device and the lens,
wherein the lens barrel is bonded to the optical device board based completely upon the predetermined position.

11. An optical communication module for coupling to an optical fiber comprising:
a printed wiring board having a pad and an optical device bonded to the pad at a measured position, the printed wiring board also defining a plurality of semi-circular via holes;
a base board having a plurality of base board pads, each base board pad being aligned with one of the plurality of semi-circular via holes;
a conductive bonding paste applied to each of the plurality of semi-circular via holes and the base board pads to couple the printed wiring board and the base board together; and
an optical assembly including a lens barrel housing a lens, wherein the optical assembly is mounted to be the printed wiring board using a calculated position based upon the measured position so that the optical device and lens are aligned.

12. The optical communication module according to claim 11, wherein the optical fiber is a plastic optical fiber.

13. The optical communication module according to claim 11, wherein the measured position is a transverse dimension and a vertical dimension.

\* \* \* \* \*